(12) United States Patent
McConville et al.

(10) Patent No.: US 7,155,819 B2
(45) Date of Patent: Jan. 2, 2007

(54) SYSTEM FOR MAKING A CONDUCTIVE CIRCUIT ON A SUBSTANTIALLY NON-CONDUCTIVE SUBSTRATE

(75) Inventors: David P McConville, Chandler, AZ (US); Mark Vininski, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 385 days.

(21) Appl. No.: 10/612,705

(22) Filed: Jun. 30, 2003

(65) Prior Publication Data

US 2004/0262029 A1 Dec. 30, 2004

(51) Int. Cl.
*H05K 3/02* (2006.01)

(52) U.S. Cl. .............................. 29/847; 29/745; 29/825; 29/831; 29/849; 29/872; 174/250; 174/255; 216/18; 216/41

(58) Field of Classification Search ................... 29/745, 29/825, 831, 847, 849, 872; 174/250, 255; 216/18, 41
See application file for complete search history.

(56) References Cited

U.S. PATENT DOCUMENTS 5,173,442 A * 12/1992 Carey ........................ 216/18

6,026,563 A * 2/2000 Schilson ...................... 29/825

* cited by examiner

*Primary Examiner*—A. Dexter Tugbang
*Assistant Examiner*—Tim Phan
(74) *Attorney, Agent, or Firm*—Schwegman, Lundberg, Woessner & Kluth, P.A.

(57) ABSTRACT

A method for forming a conductive circuit on a substantially non-conductive substrate includes indenting a major surface of a substrate with a plurality of features, plating the major surface and the indentations formed with a conductive layer, and removing a portion of the conductive layer leaving at least one of the plurality of the indentations filled with conductive material separated from at least one other of the plurality of the indentations filled with conductive material separated by non-conductive material. An electrical device formed includes a sheet of insulative material having grooves therein. The sheet of insulative material has a first planar surface, and a second planar surface. A conductive material is positioned within the grooves. The conductive material within the grooves forms electrical traces in the electrical device. The conductive material within the grooves fills the groove and includes a surface coplanar with at least one of the first planar surface or the second planar surface. Other electrical devises can be formed using multiple sheets formed with electrical traces.

27 Claims, 10 Drawing Sheets

SYSTEM FOR MAKING A CONDUCTIVE CIRCUIT ON A SUBSTANTIALLY NON-CONDUCTIVE SUBSTRATE

FIELD OF THE INVENTION

The present invention is related to printed circuit boards. More specifically, the present invention relates to a method and apparatus method and apparatus for forming printed circuit boards using imprinting and grinding.

BACKGROUND OF THE INVENTION

A printed circuit board ("PCB") is a multi-layer plastic board that includes printed circuits on one or more layers of insulative material. A printed circuit is a pattern of conductors that corresponds to the wiring of an electronic circuit formed on one or more layers of insulative material. The printed circuit board includes electrical traces that are routed on the various layers of the PCB. PCBs also include vias which are solid electrical paths connecting one layer to another layer. A via can be used to connect a trace on one layer of a PCB to another trace on another layer of the PCB. A PCB also includes other layers of metallization for ground planes, power planes or reference voltage planes.

One conventional way to make a PCB is to start with a sheet or strip of dielectric coated with a conductive metal such as copper. Using various drilling, plating, lithographic and metal etching steps a pattern is then formed leaving metal where traces are desired. The traces are on top of the sheet or strip of dielectric. One sheet forms one layer of the PCB.

Another conventional way to make a PCB is to start with a sheet or strip of non-conductive plastic or ceramic, deposit ink in a pattern that forms the conductive traces, sinter the ink to form metal traces. The sheet or strip of non-conductive plastic or ceramic is sometimes referred to as a manufacturing panel. Fiducial markings or coupons are placed on the manufacturing panels. A PCB can have several layers of traces. Five or six layers is common for a multi-layer PCB. Each layer is formed on a manufacturing panel and then the various layers are registered with the fiducial markings or coupons and bonded together. The manufacturing panels form a laminate that includes a number of individual PCBs. The laminate formed is then further processed. Vias or paths from one layer to another layer within the PCB are formed by drilling through the PCB to hit various pads on each of the layers. The pads are generally large enough to account for any inaccuracies associated with routing design or misregistration between the layers of the PCB. A PCB may also include various planes for power, ground reference or another voltage reference. As a result, each PCB requires substantial routing of signal lines and power-supply capability. Design changes are difficult to make. Accounting for inaccuracies, such as making large inner pads for a via, limits the density of the signal carrying lines and makes routing more difficult. Furthermore, the resulting PCB typically has stub traces that may result in undesirable electrical qualities. For example, such stubs vary the impedance and may result in crosstalk between signal lines. Another aspect of current PCBs is that each plate carries a single layer of traces. Once the further processing of laminate formed is complete, the manufacturing panel is cut or singulated to form individual printed circuit boards.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

In the following detailed description of the preferred embodiments, reference is made to the accompanying drawings that form a part hereof, and in which are shown by way of illustrating specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

Figure 1:
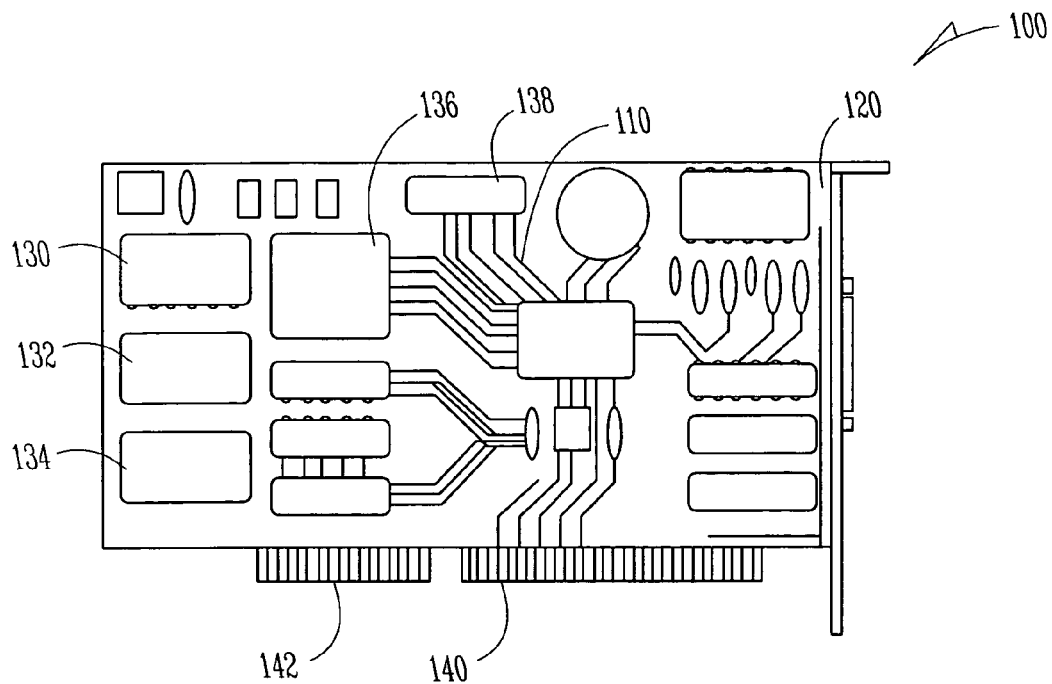
FIG. 1 is a top view of a printed circuit board, according to an embodiment of the invention.

FIG. 1 is a top view of a printed circuit board 100, according to an embodiment of the invention. The printed circuit board ("PCB") 100 is a multi-layer plastic board that includes patterns of printed circuits on one or more layers of insulated material. The patterns of conductors correspond to wiring of an electronic circuit formed on one or more of the layers of the printed circuit board 100. The printed circuit board 100 also includes electrical traces 110. The electrical traces 110 can be found on an exterior surface 120 of a printed circuit board 100 and also can be found on the various layers within the printed circuit board 100. Printed circuit boards also include through holes (not shown in FIG. 1 but shown in FIGS. 10–11) which are used to interconnect traces on various layers of the printed circuit board 100. The printed circuit board can also include planes of metallized materials such as ground planes, power planes, or voltage reference planes (not shown in FIG. 1). Through holes can also be used to interconnect like planes in the printed circuit board 100. A through hole can either be a plated through hole which is essentially a hollow conductor formed within the printed circuit board 100 for interconnecting conductors or layers of a printed circuit board, or it can be a via which is a solid conductor used to interconnect layers of the printed circuit board 100.

The printed circuit board 100 is also populated with various components 130, 132,134, 136, 138. The components 130,132, 134, 136, 138 can either be discreet components or semiconductor chips which include thousands of transistors. The components 130, 132, 134, 136, 138 can use any number of technologies to connect to the exterior surface 120 of the circuit board or to the printed circuit board 100. For example, pins may be inserted into plated through holes or pins may be extended through the printed circuit board 100. An alternative technology is surface mount technology where an electrical component, such as component 136, mounts to an array of pads on the exterior surface 120 of the printed circuit board 100. For example, component 136 could be a ball grid array package or device that has an array of balls or bumps that interact or are connected to a corresponding array of pads on the exterior surface 120 of the printed circuit board 100. The printed circuit board 100 can also include connectors for making external connections to other electrical or electronic devices.

As shown in FIG. 1, the printed circuit board 100 includes a first edge connector 140 and a second edge connector 142. As shown in FIG. 1 there are external traces, such as electrical trace 110, on the external surface 120 of the printed circuit board 100 that connect to certain of the outputs associated with the first edge connector 140. Other traces that connect with the edge connectors 140, 142 will have traces internal to the printed circuit board 100.

Many of the electrical components which are used to populate the printed circuit board 100 are expensive. For example, a central processing chip, that may cost hundreds or thousands of dollars, is generally mounted on a printed circuit board 100. As a result, it is desirable to test the integrity of printed circuit boards, such as printed circuit board 100, before electrical components, such as electrical components 130, 132, 134, 136, 138, are mounted onto the printed circuit board 100. It should be noted that printed circuit boards are also called boards or circuit boards. Once populated many of the printed circuit boards are called cards or adapters. Printed circuit boards are prevalent and are used in computers and other devices. For example, printed circuit boards are used in computers and are referred to as motherboards, expansion boards, daughter cards, controller cards, network interface cards, or video adapters or video graphics adapters. It should be noted that these are just a small sample of the many different types of electronic devices that are based upon a printed circuit board, such as the one shown in FIG. 1.

Figure 2:
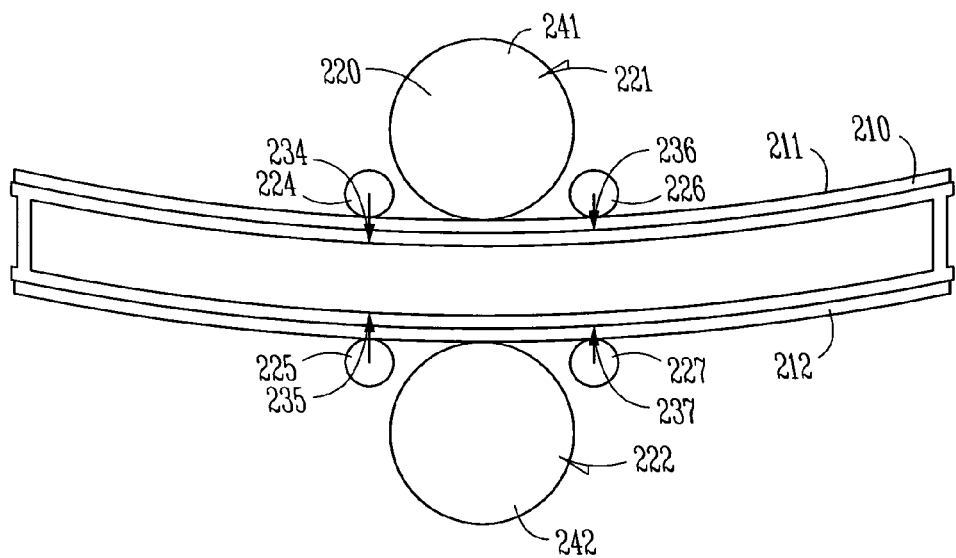
FIG. 2 is a side view of a panel of material passing through a roller mechanism to indent the panel of the material, according to an embodiment of this invention.

FIG. 2 is a side view of a panel 210 of material passing through a roller mechanism 220 to indent the panel 210 of the material, according to an embodiment of this invention. The roller mechanism includes a first indenting roller 221 and a second indenting roller 222. The roller mechanism 220 also includes load rollers 224, 225, 226, 227. The load rollers 224, 225, 226, 227 apply opposing loads, depicted by arrows 234, 235, 236, 237, on the panel 210 to flatten the panel 210 in and around the area of the roller mechanism 220. For example, load roller 224 opposes or is positioned directly, or nearly directly, opposite from load roller 225. The force produced by load roller 224 is load 234 which is directly opposite the load 235 produced by load roller 225. Similarly, load roller 226 is positioned opposite load roller 227. Load roller 226 produces load 236 which directly opposes the load 237 produced by the load roller 227. The various loads 234, 235, 236, 237 as well as loads produced by the first indenting roller 221 and the second indenting roller 222 flatten the panel of material 210 in the area of the roller mechanism 220. The panel of material 210 is a non-insulated material such as ABF plastic, a thermoplastic, or any other type of thermoset plastic. The panel of material 210, after processing which will be discussed below, becomes one layer in a printed circuit board. It should be also noted that some circuit boards may have a single layer so another option is that the panel 210 may become a single layer in a printed circuit board. The first indenting roller 221 and the second indenting roller 222 are provided with pattern surfaces 241 and 242, respectively.

As the first indenting roller 221 roles and places a load on a major surface 211 of the panel of material 210, the pattern surface 241 of the first indenting roller 222 forms indentations within the major surface of the panel 211. Similarly, as the second indenting roller 222 rolls or places a load on a second major surface 212 of the panel of material 210, the pattern surface 242 produces indentations and patterns in the second major surface 212 of the panel of material 210. It should be noted that indentations can produce all sorts of features including openings that pass through the panel of material 210 from the first major surface 211 to the second major surface 212. In other words, the features on the surface 241 of the first indenting roller 221 and the features on the surface 242 of the second indenting roller 222 can include channels or pathways, paths, and through holes. It should be noted that the first indenting roller 221 and the second indenting roller 222 are indexed with respect to each other so that as the indentations are made in the first major surface 211 and the second major surface 212 of the panel of material 210, the features will be registered with one another as patterns of traces, through holes and pads are registered from layer to layer within a printed circuit board, such as printed circuit board 100 shown in FIG. 1.

After the panel of material 210 and specifically the first major surface 211 and the second major surface 212 of the panel have been indented with the features from the surface 241 of the first indenting roller 221 and the features associated with the surface 242 of the second indenting roller 222, the panel of material 210 is plated with an electrically conductive material.

Figure 3:
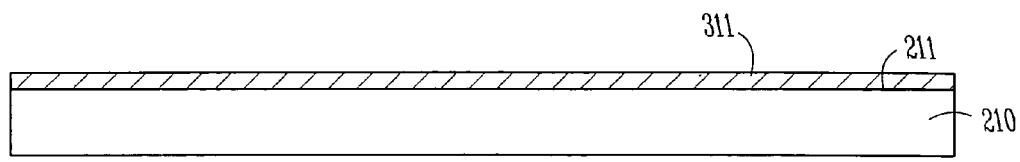
FIG. 3 is a side view of a panel of material after plating one of the major surfaces of an indented panel with a conductive material, according to an embodiment of this invention.

FIG. 3 is a side view of a panel of material 210 after plating one of the major surfaces 211 of the indented panel 210 with a conductive material 311, according to an embodiment of this invention. Although plating is mentioned as one way of placing conductive material 311 on to the first major surface 211 of the panel of material 210, there are many other ways to deposit conductive material 311 on to the first major surface 211 of the panel of material 210. For example, in addition to plating, the panel 210 could be placed in a chamber and conductive material 311 could be sputtered or placed thereon by chemical vapor deposition. It is contemplated that any form of depositing a conductive material 311 on to the surface 211 of the panel of material 210 is within the scope of this invention. Furthermore, the panel of material 210 is not necessarily of a specific size. In fact, the panel of material 210 could be part of a continuous role of material that eventually becomes a layer, or one of a number of layers, in a printed circuit board such as the one shown in FIG. 1. The panel of material 210 could also be called a substrate on which the electrical traces, pads, and through holes are formed.

Figure 4:
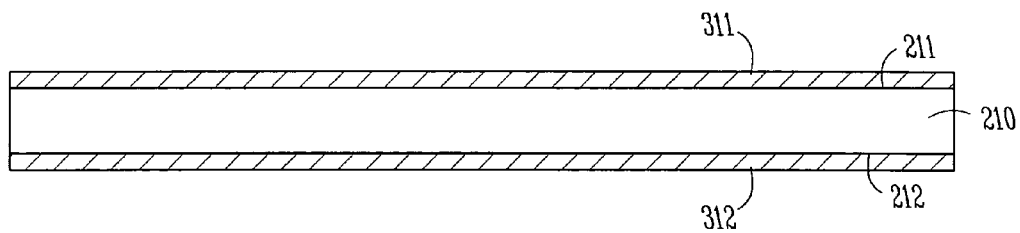
FIG. 4 is a side view of a panel of material after plating two of the major surfaces of an indented panel with a conductive material, according to an embodiment of this invention.

FIG. 4 is a side view of the panel of material 210 after depositing conductive material on the first major surface 211 and the second major surface 212 of the indented panel 210, according to an embodiment of this invention. As shown in FIG. 4, the first major surface 211 has a conductive layer 311 placed thereon, and the second major surface 212 has a second layer of conductive material 312 deposited thereon. The deposited conductive material surfaces 311 and 312 fill the indentations or features which are produced by the surfaces 241 and 242 of the first indenting roller 221 and the second indenting roller 222, respectively (as shown in FIG. 2).

Figure 5:
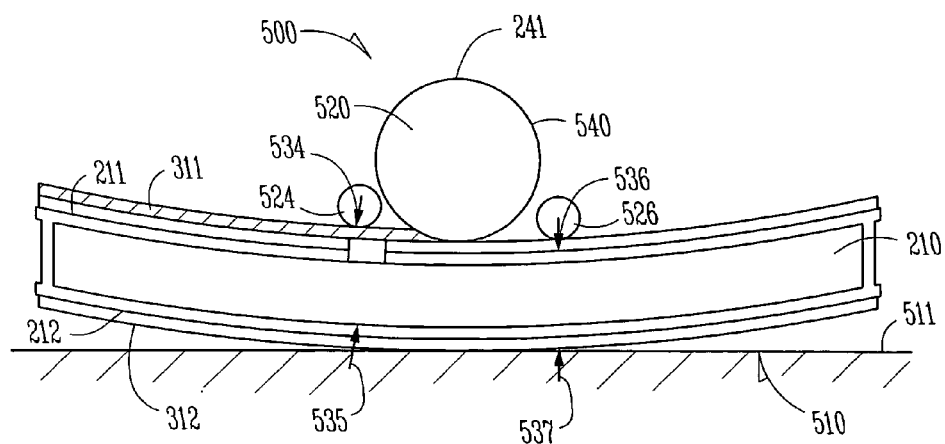
FIG. 5 is a side view of a grinder mechanism removing at least a portion of the plated material from one surface of the panel, according to an embodiment of this invention.

FIG. 5 shows a side view of a grinder mechanism removing at least a portion of the plate for deposited conductive material 311 from the first major surface 211 of the panel of material 210, according to an embodiment of this invention. The panel of material 210 is placed on a flat, stiff plate, depicted by reference numeral 510. The flat, stiff plate 510 includes a flat, stiff surface 511. The grinding mechanism 500 includes a grinder 520 which has a grinding surface 540. The grinder 520 rotates with respect to the first major surface 211 of the panel of material 210 as it is passed over the flat, stiff plate 510. The grinding mechanism also includes a first load roller 524 and a second load roller 526 positioned on either side of the grinder 520. The first load roller 524 produces a load depicted by an arrow having a reference number 534. Similarly the second load roller 526 produces a load depicted by the arrow carrying a reference numeral 536. The flat, stiff plate produces forces which counter the loads 534 and 536. As shown in FIG. 5, a load 535 counter acts the load 534 while a load 537 counteracts the load 536. The load rollers 526, 524 flatten the surface of the substrate or panel of material 210 as it is being ground or as the portion of the conductive surface 311 is removed from the first major surface 211 of the panel of material 210. By removing a portion of the conductive material 311, conductive material only remains in the indentations or various features formed in the indentations in the panel of material 210.

In some embodiments of the invention the grinding mechanism 500 is set at a level so that a portion of the electrically conductive material 311, as well as a portion of the first major surface 211, are removed by the grinder 520. This assures that the conductive material that remains in the features or indentations within the panel of material 210 are electrically isolated from one another or are separated by non-conductive material. As mentioned previously, the panel of material 210 is made of a non-conductive plastic, such as ABF plastic, thermoplastic or thermoset plastic. It should also be noted that when both sides of the panel of material 210 are indented, both sides are treated as shown in FIG. 5. In other words, a portion of the electrically conductive material 312 is removed from the second major surface 212 of the panel of material 210. Also, in some embodiments, the grinding process or grinder 520 may be set to also remove a portion of the second major surface 212. As shown in FIG. 5, the second major surface 212 has already had the portion of the conductive layer 312 removed. In other words, the second major surface 212 was already treated in the panel of material 210 shown in FIG. 5.

Figure 6:
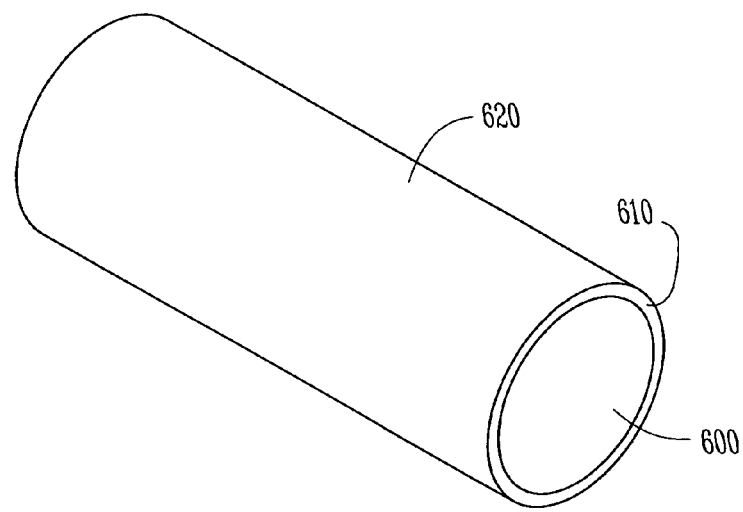
FIG. 6 is a perspective view of a roller carrying a plate, according to an embodiment of this invention.

FIG. 6 is a perspective view of an indenting roller 600 which carries a plate 610 having an intending surface 620, according to an embodiment of this invention. The roller 600 is a continuous roller which has a width that roughly corresponds to the width of the panel of material 210. Roller 600 includes a plate 610. The plate 610 is removable from the roller 600. In other words, the plate 610 is interchangeable with other plates that can be placed on the roller 600. The plate 610 includes a surface 620. The surface 620 includes features which are rolled into the major surfaces of the panel of material 210 (shown in FIG. 2). The features result in indentations in the first major surface 211 or the second major surface 212 of the panel of material 210. The plate 610 is interchangeable with other plates because as the roller 600 and the plate 610 roll over the panel of material 210 the features 620 on the surface of the plate 610 eventually wear to the point where the indentations produced by the feature 620 are unacceptable.

Figure 7:
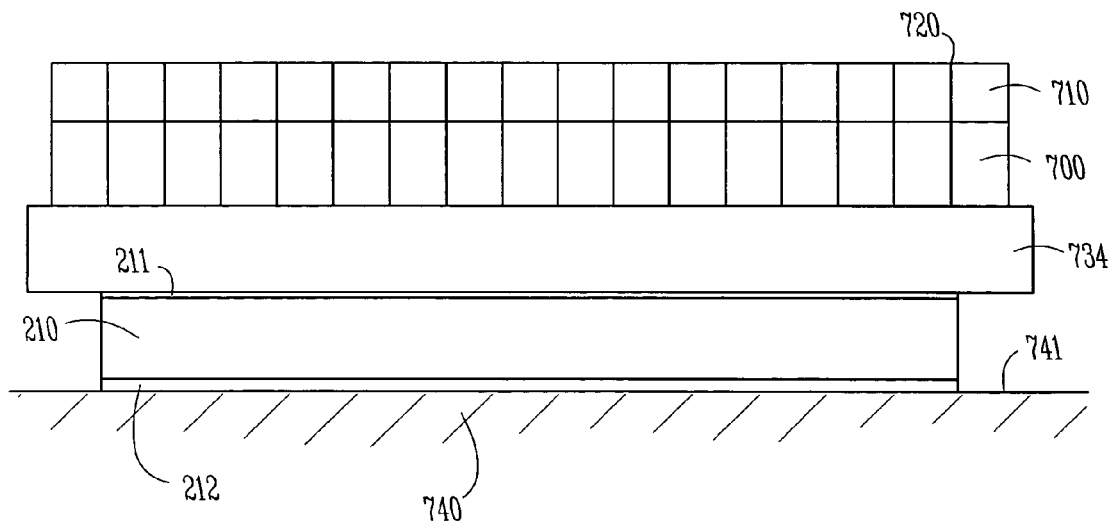
FIG. 7 is a front view of a roller that indents a panel of material and a load roller, according to an embodiment of this invention.

A new plate 610 having the same pattern of feature 620 can then be placed upon the roller 600 to continue the operation of forming printed circuit boards such as printed circuit board 100, from the panel of material 210. A plate 610 is formed from a mold of a master surface. A master surface having features similar to the features 620 on plate 610 is first formed and qualified. Once formed and qualified, a mold is then formed of the plate or of the master. A plate 610 is formed having the feature 620 by forming the plate from the mold. In some instances the original master is referred to as the father, the mold from the master or father is referred to as the mother and the plate that is formed from the mother is referred to as the son. Therefore as the plates, such as plate 610 wear, the plate 610 can be replaced with another son made from the mold or mother. Multiple mothers can be made from the master and multiple sons can be made from each mold or mother. As a result, there is very little wear on the master and the master will last for a long time. It should be noted that the indentation process can also be done on a single side of a panel of material 610. FIG. 7 shows such an arrangement.

FIG. 7 is a front view of a roller 700 having a plate 710, according to an embodiment of this invention. The plate 710 includes feature 720. The plate 710 is removable and interchangeable so that it may be changed out with respect to the roller 700. As shown in FIG. 7, the roller 700 is used to indent a panel of material 210 having a first major surface 211 and a second major surface 212. Specifically, the roller 700 is being used to indent the first major surface 211 of the panel of material 210. In the front of the roller 710 is a load roller 734. The load roller 734 produces a localized load on the panel of material 210 in the area of the indenting roller 700. The load roller 734 flattens the panel of material 210 against a flat stiff plate 740 and specifically against a surface 741 of the flat stiff plate 740. The end result is that the roller 700 produces indentations on a single side associated with the first major surface 211 of the panel of material 210. The feature 720 correspond to channels, through holes and pads associated with one particular layer of a printed circuit board in a finished printed circuit board. The features formed in the first major surface 211 of the panel of material 210 are filled with conductive material and then ground, as discussed with respect to FIGS. 2–5 above. The second major surface 212 of the panel of material 210 can be similarly treated, plated and ground so that the panel of material has two surfaces of electrical traces. Another option is to leave the panel 210 having a single surface with indentations and traces and pads filled with conductive material.

Figure 8:
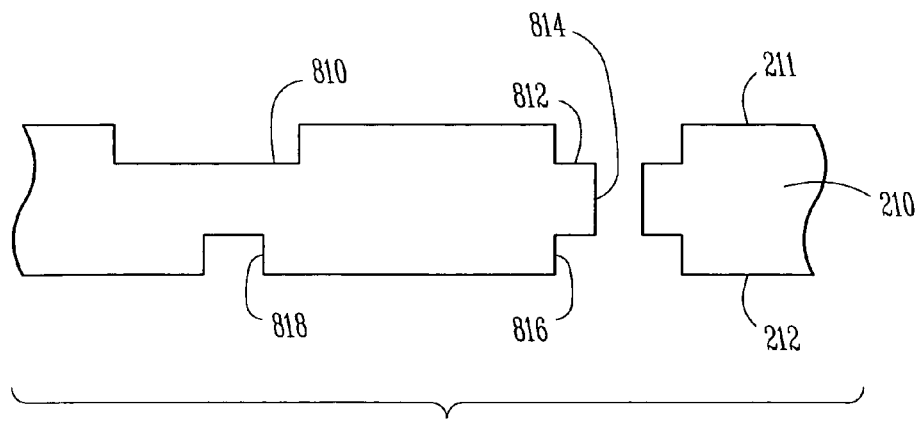
FIG. 8 is a cross-sectional side view of a portion of a panel of material after the panel of material has been indented, according to an embodiment of this invention.
Figure 9:
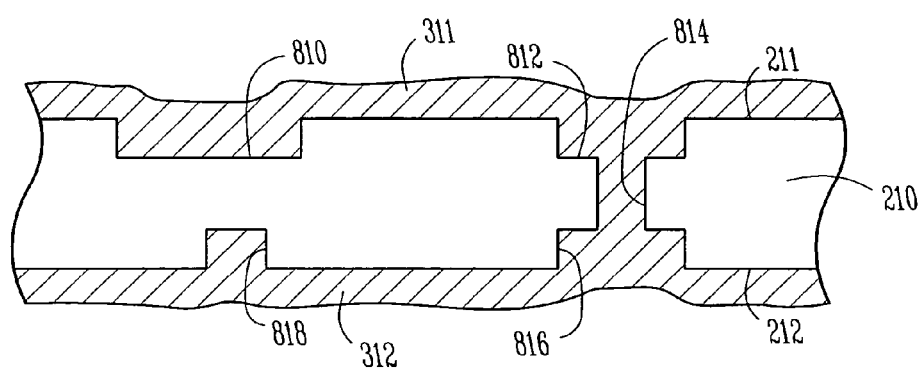
FIG. 9 is a cross-sectional side view of a portion of an indented panel of material after the panel of material has been plated, according to an embodiment of this invention.
Figure 10:
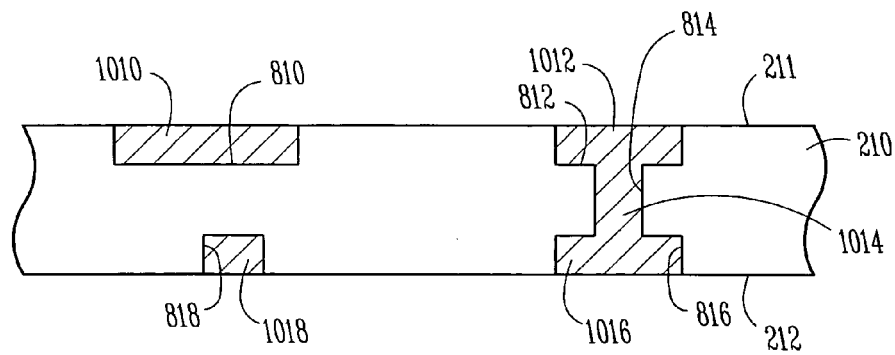
FIG. 10 is a cross-sectional side view of a portion of an indented panel of material after a portion of the plated material has been removed, according to an embodiment of this invention.

FIGS. 8–10 are cross-sectional side views of a panel of material during the various stages of forming a layer or two layers of a printed circuit board. FIG. 8 is a cross-sectional side view of a portion of a panel of material 210 after the panel has been indented, according to an embodiment of this invention. As shown in FIG. 8, the first major surface 211 has been indented with a channel 810 that corresponds to a trace in electrical circuit. The channel 810 occurs in the first major surface 211 of the panel of material 210. Also formed by the indentation process is a pad 812 and a through opening 814 and a pad 816. Pads 812 and 816 correspond to the through opening 814. Pad 812 is positioned or in the first major surface 211 of the panel of material. Pad 816 is in the second major surface 212 of the panel of material. The through hole 814 extends from the first pad 812 to the second pad 814. The through hole 814 extends through the panel of material. Another channel 818 is also formed in the second major surface 212 of the panel of material. It should be noted that the channel 810 corresponds to a trace and the channel 818 also corresponds to an electrical trace in a finished printed circuit board, such as the printed circuit board 100 shown in FIG. 1. The trace 810 is wider than the trace 818, since the trace 810 occurs along the cross-sectional cut and the trace 818 is shorter since the cross-sectional cut through the panel of material 210 crosses the electrical trace 818.

FIG. 9 shows the panel of material 210 after the first major surface 211 and the second major surface 212 have had conductive material 311 deposited on the first major surface 211 and conductive material 312 deposited on the second major surface 212 of the panel of material, according to an embodiment of this invention. As mentioned above the conductive material 311, 312 can be deposited in any number of ways. The end result is that the channels 810, 818 and the pads 812, 816 and the through hole 814 are all completely filled with conductive material 311, 312. It should be noted that the electrically conductive material 311, 312 is the same. Furthermore, it should be noted that the conductive material 311, 312 can be plated on to the pad of material, and in that case, the first major surface 211 and the second major surface 212 are plated or have electrically conductive material 311, 312 placed on both sides of the panel of material simultaneously. If other processes are used the first major surface 211 may have to have their electrically conductive material 311 deposited thereon in a first operation and the second major surface 212 of the panel of material 210 may have to have electrically conductive material 312 added in a separate operation.

FIG. 10 is a cross-sectional side view of the portion of the indented panel of material 210 after a portion of the electrically conductive material 311, 312 has been removed, according to an embodiment of this invention. The end result is that the indentations for traces 810, 818 are now filled with electrically conductive material 311, 312 and are separated from other traces and other electrical features of the panel by insulative material of the panel of material 210. Thus the channels 810 and 818 result in electrical traces 1010 and 1018. Also formed is a via 1014 within the opening 814 in the panel of material 210 as well as pads 1012 and 1016 on each end of the via 1014. Pad 1012 is formed in the indentation 812 and pad 1016 is formed in the indentation 816. All electrically conductive features are isolated from other features. As mentioned previously, a portion of the electrically conductive material 311, 312 can be removed in addition to a portion of the first major surface 211 and the second major surface 212 so as to assure that the features formed are located within the various indentations 810, 818, 812, 816. It is also worthy of note that the traces 1010, 1018 and the pads 1012, 1016 are flush with respect to the first major surface 211 and the second major surface 212 of the panel of material. In other words, the electrical traces 1010, 1018 are not on top of the first major surface 211 and the second major surface 212 of the panel of material 210. Similarly the pads 1012, 1016 are also not atop the first major surface 211 and the second major surface 212 of the panel 210, but rather are flush with the first major surface 211 and the second major surface 212. It should be noted that features are formed on two surfaces of the panel of material 210 as shown in FIG. 10. Thus, a single panel of material or a single layer of material yields two layers of electrical traces or electrical features. As a result, a printed circuit board having two layers of features is much thinner than conventional printed circuit boards since the panel of material 210 includes two layers of electrical features. In conventional design, a print circuit board having two layers of electrical features would require two panels of material or two layers of insulated material. It should also be noted that indentations can be made on a single surface and so a single layer of electrical features can be formed on just one side of a panel of material 210 to form a single surface printed circuit board.

An advantage of forming two layers of electrical features on a single panel of material 210 is that it is not necessary to join two layers to form the required printed circuit.

An electrical device includes a sheet of insulative material having indentations or grooves 810, 812 therein. The sheet of insulative material has a first planar surface 211, and a second planar surface 212. A conductive material 311 is positioned within the indentations or grooves 810, 812. The conductive material within the indentations or grooves forms electrical traces 1010, 1012 in the electrical device. The conductive material 311 within the indentations or grooves 810, 812 fills the groove and includes a surface coplanar with at least one of the first planar surface 211 or the second planar surface 212. In some embodiments, the first planar surface 211 of the sheet of the insulative material or panel of material 210 has indentations or grooves 810, 812 therein, and the second planar surface 212 of the insulative material has indentations or grooves therein. The indentations or grooves 810, 812 in the first planar surface 211 and the second planar surface 212 of the sheet of the insulative material 210 are filled with the conductive material. The conductive material 311, 312 within the grooves in the first planar surface 211 includes a surface coplanar with the first planar surface. The conductive material 312 within the grooves 816, 818 in the second planar surface 212 also includes a surface coplanar with the second planar surface.

The electrical device includes an exterior surface 211. The exterior surface 211 of the electrical device includes features that are flush with the exterior surface 211 of the device. In some embodiments, the features that are flush with the exterior surface 211 of the device are pads 1012. The exterior surface 211 is ground or formed by grinding.

The electrical device includes an exterior surface 211. The exterior surface 211 of the electrical device includes features that are flush with the exterior surface 211 of the device. In some embodiments, the features that are flush with the exterior surface 211 of the device are pads 1012. The exterior surface 211 is ground or formed by grinding.

Figure 11:
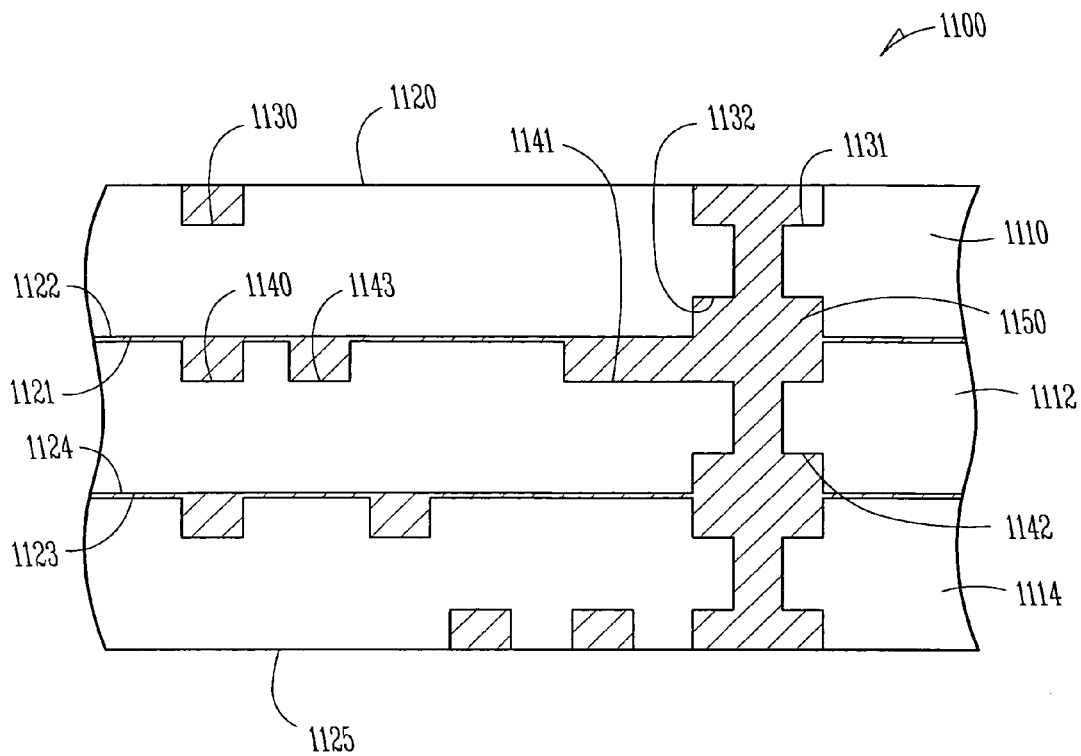
FIG. 11 is a cross-sectional side view of several panels joined to form a multi-layer electrical device, according to an embodiment of this invention.

FIG. 11 is a cross-sectional side-view of several panels of material 1110, 1112, 1114 joined together to form a multi-layer electrical device 1100, according to an embodiment of this invention. Multi-layer electrical device 1100 includes six layers of electrical traces in the three panels of material 1110, 1112, 1114. The electrical traces are formed in indentations or grooves 1130, 1131, 1132 associated with the first panel of material 1110, and in grooves 1140, 1141, 1142 or indentations formed in the second panel of material 1112. The first panel of material 1110 includes a first major surface 1120 and a second major surface 1121. The second panel of material 1112 includes a first major surface 1122 and a second major surface 1123. The third panel of material 1114 includes a first major surface 1124 and a second major surface 1125. All of the major surfaces 1120, 1121, 1122, 1123, 1124, 1125 are planar surfaces or substantially planar surfaces having the grooves or indentations therein.

The grooves or indentations are only numbered for two of the panels of material 1110, 1112. The grooves or indentations were not numbered for the panel of material 1114 for the sake of clarity. The grooves or indentations associated with the first panel of material 1110, the second panel of material 1112, and the third panel of material 1114, have grooves or indentations such as grooves or indentations 1130, 1131, 1132, 1140, 1141, 1142, 1143 that are filled with an electrically conductive material 1150. The electrically conductive material 1150 forms electrical traces in the first panel of material 1110, the second panel of material 1112, and the third panel of material 1114 as well as between the various panels of material 1112, 1114, 1110. As can be seen by electrical device 1100, its form can be much thinner than other electrical devices which have a layer of electrical traces on each layer within the electrical device.

As shown in FIG. 11, each layer of the electrical device which corresponds to a panel of material 1110, 1112, 1114 includes two layers of electrical devices or electrical traces. Further advantage of this multi-layer electrical device 100 shown in FIG. 11 is that certain imprecise processes are no longer necessary to form the printed circuit board. For example, forming a via generally included forming a drill opening within the multi-layer device and hitting various pads in various layers of the printed circuit board. As shown in FIG. 11, a multi-layer printed circuit board 1100 formed using the systems and devices as well as the method described in the figures of this application will no longer require drilling through several layers of printed circuit board. Another advantage of this invention is that the traces can be more closely spaced and the traces can be made smaller since the various layers formed are merely placed together and then bonded.

In some embodiments, the electrical device has a first sheet and a second skeet of insulative material formed from a first panel of material 1110 and a second panel of material 1112. Both the first sheet and the second sheet of insulative material have a first planar surface 1120, 1122 and a second planar surface 1121, 1123 with grooves or indentations 1130, 1131, 1132, 1140, 1141, 1142, 1143 therein that are filled with a conductive material 1150. The conductive material 1150 forms electrical traces in the first sheet of insulative material and the second sheet of insulative material when the first sheet of insulative material is attached to the second sheet of insulative material. The two sheets, when attached, form a multi-layered electrical device 1110.

Figure 12:
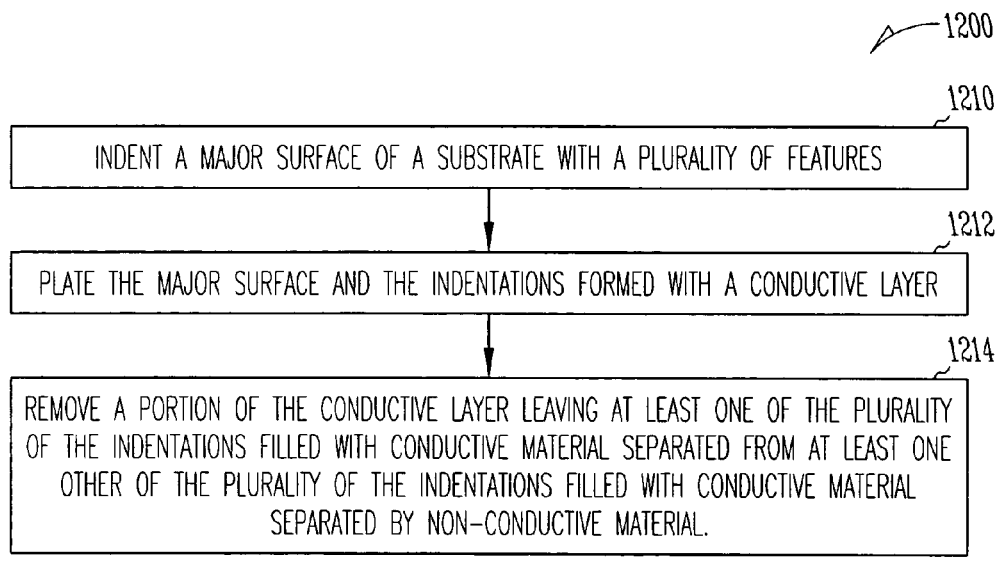
FIG. 12 is a flow diagram showing a method of forming a conductive circuit on a non-conductive substrate or panel, according to an embodiment of this invention.

FIG. 12 is a flow diagram showing a method of forming a conductive circuit on a non-conductive substrate or panel 1200, according to an embodiment of this invention. The method for forming a conductive circuit on a substantially non-conductive substrate 1200 includes indenting a major surface of a substrate with a plurality of features 1210, plating the major surface and the indentations formed with a conductive layer 1212, and removing a portion of the conductive layer leaving at least one of the plurality of the indentations filled with conductive material separated from at least one other of the plurality of the indentations filled with conductive material separated by non-conductive material 1214. The major surface of the substrate is indented with a roller. In some embodiments, the major surface of the substrate is indented with a plurality of indenting devices. Removing a portion of the conductive layer 1212 includes grinding a portion of the conductive layer 311 (shown in FIG. 5). A conductive circuit is formed on a substantially non-conductive substrate, according to the method set forth in this paragraph.

Figure 13:
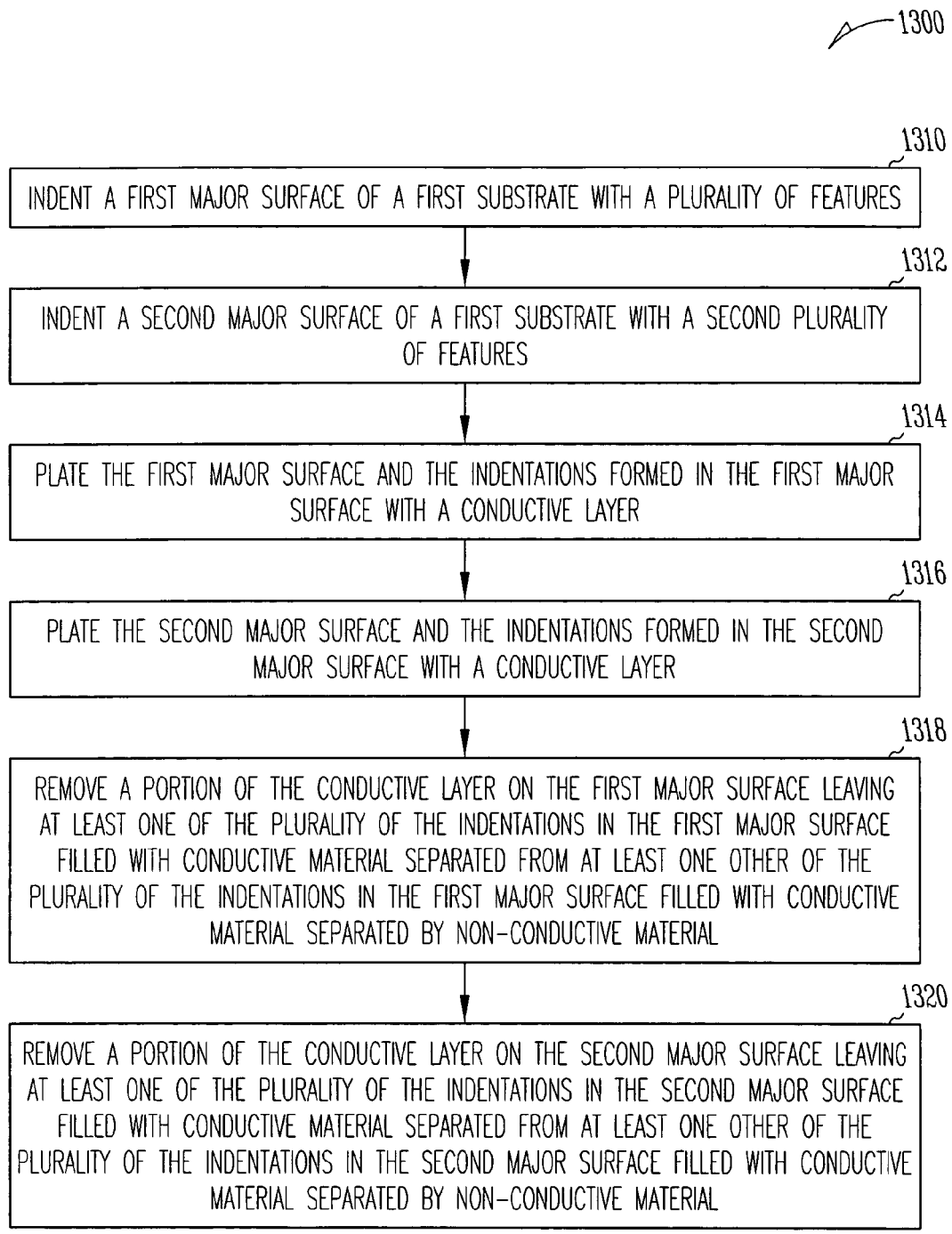
FIG. 13 is a flow diagram showing another method of forming a conductive circuit on a non-conductive substrate or panel, according to an embodiment of this invention.

FIG. 13 is a flow diagram showing another method of forming a conductive circuit on a non-conductive substrate or panel 1300, according to an embodiment of this invention. The method for forming a conductive circuit on a substantially non-conductive substrate 1300 also includes indenting a first major surface of a first substrate with a first plurality of features 1310, indenting a second major surface of a first substrate with a second plurality of features 1312, plating the first major surface and the indentations formed in the first major surface with a conductive layer 1314, and plating the second major surface and the indentations formed in the second major surface with a conductive layer 1316. The method 1300 further includes removing a portion of the conductive layer on the first major surface leaving at least one of the plurality of the indentations in the first major surface filled with conductive material separated from at least one other of the plurality of the indentations in the first major surface filled with conductive material separated by non-conductive material 1318, and removing a portion of the conductive layer on the second major surface leaving at least one of the plurality of the indentations in the second major surface filled with conductive material separated from at least one other of the plurality of the indentations in the second major surface filled with conductive material separated by non-conductive material 1320.

Once the panel has been formed with multiple layers, or once a panel is formed having two layers and that is what is desired for a final product, the panel of material 210 will be sliced into individual printed circuit boards such as printed circuit board 100 shown in FIG. 1. As mentioned previously, there are many types of printed circuit boards and FIG. 1 only shows one type of printed circuit board. The invention contemplates manufactured printed circuit boards for all applications.

Figure 14:
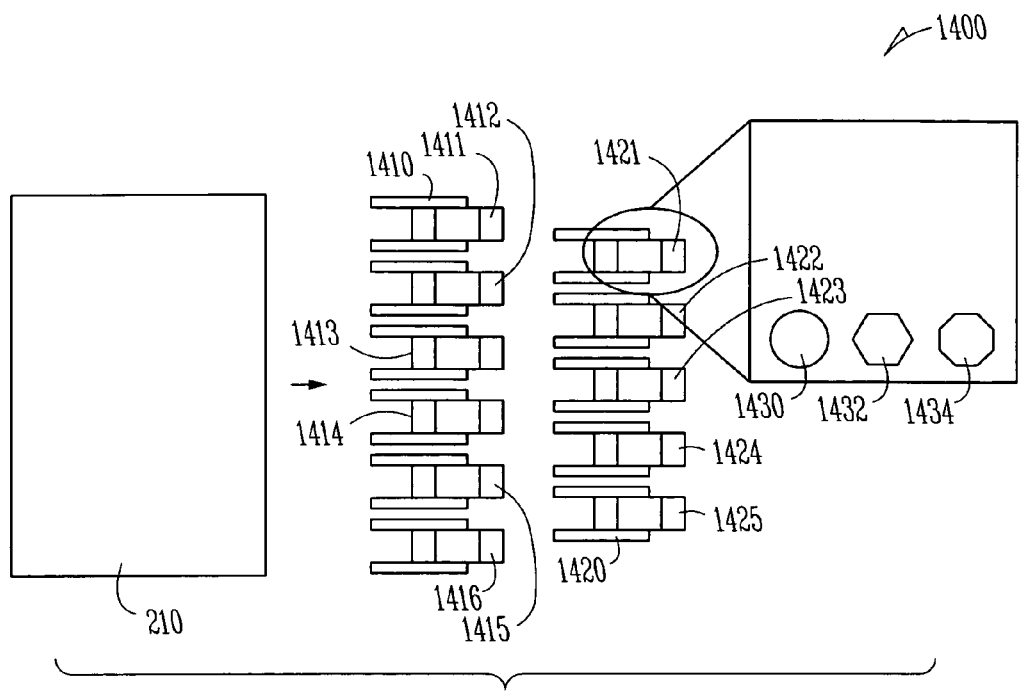
FIG. 14 is a top view of a panel and an indenting system including a set of rollers for forming indented features on the panel, according to an embodiment of this invention.

FIG. 14 is a top view of a panel of material 210 and an indenting system 1400 including a set of rollers 1410 and a set of rollers 1420 for forming indented features on the panel of material 210, according to an embodiment of this invention. The first set of rollers 1410 includes individual rollers 1411, 1412, 1413, 1414, 1415, and 1416. The second set of rollers 1420 includes individual rollers 1421, 1422, 1423, 1424, and 1425. Each of the individual rollers 1411, 1412, 1413, 1414, 1415, 1416, 1421, 1422, 1423, 1424, and 1425 have features thereon which are used to indent the panel of material 210 to form grooves which are later filled per the previous discussion with respect to FIGS. 1–13. Each of the individual rollers in the first set of rollers 1410 and the second set of rollers 1421 need not be circular in cross-section. As shown in FIG. 14 the cross-sectional areas can be circular as depicted by reference numeral 1430 hexagonal as depicted by reference number 1432 or octagonal as depicted by reference numeral 1434. These are not the only types of cross-sectional areas that are contemplated. A roller having any cross-section that will produce an indentation or groove in the panel of material 210 is within the scope of this invention.

Figure 15:
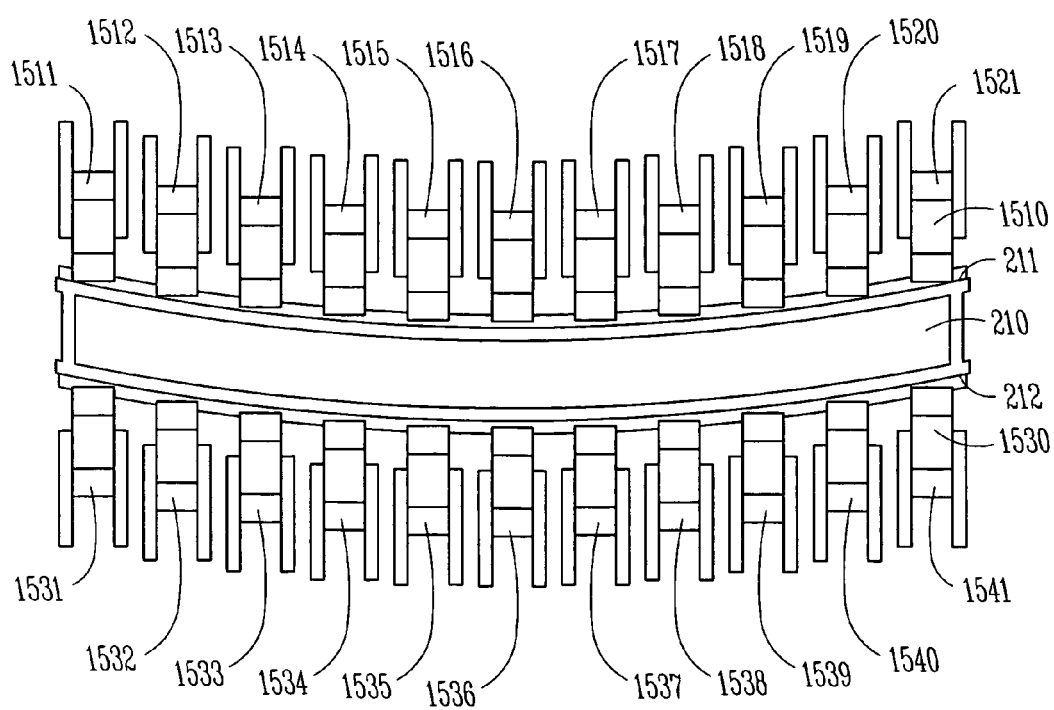
FIG. 15 is a front view of an indenting system including a first set of rollers and a second set of rollers for forming indented features on grooves on two sides of a panel, according to an embodiment of this invention.

FIG. 15 is a front view of an indenting system 1500 including a first set of rollers 1510 and a second set of rollers 1530 for forming indented features on grooves on two sides of a panel of material 210, according to an embodiment of this invention. The first set of rollers 1510 includes individual rollers 1511, 1512, 1513, 1514, 1515, 1516, 1517, 1518, 1519, 1520 and 1521. The second set of rollers 1530 includes individual rollers 1531, 1532, 1533, 1534, 1535, 1536, 1537, 1538, 1539, 1540 and 1541. The first set of rollers 1510 impact the first major surface 211 of the substrate of the panel of material 210. The second set of rollers 1530 impacts and indents or forms grooves in the second major surface 212 of the panel of material 210. Again the individual rollers or indenters need not have a circular cross-section but can have cross-sections of any type that will form indentations within the first major surface 211 and the second major surface 212 of the panel of material 210.

Figure 16:
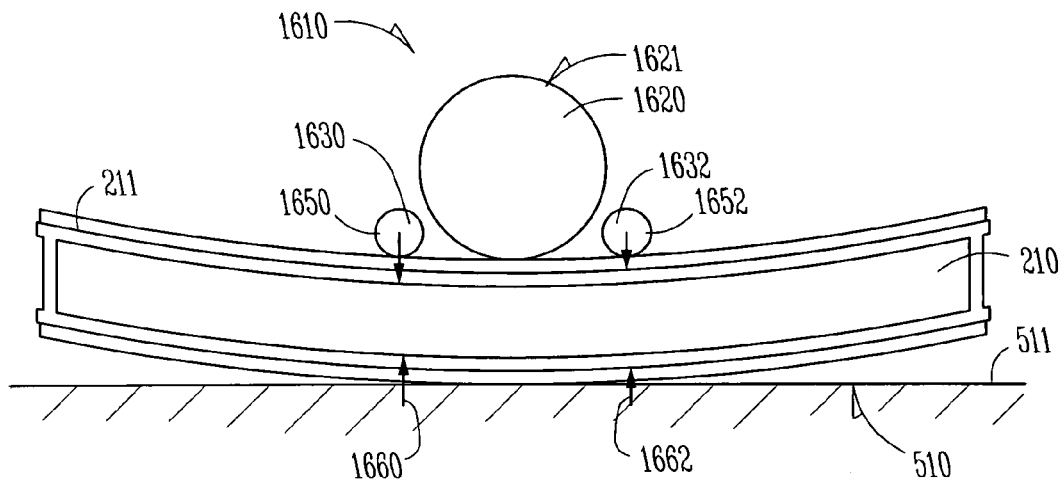
FIG. 16 is a side view of a panel of material passing through a set of rollers to indent one side of the material, according to an embodiment of this invention.

FIG. 16 is a side view of a panel of material 210 passing through a set of rollers 1610 to indent one side of the panel of material 210, according to an embodiment of this invention. The set of rollers 1610 includes an indenting roller 1620 having features on a surface 1621 of the roller used to form channels, indentations or grooves in the first major surface 211 of the panel of material 210. The set of rollers 1610 also includes a first load roller 1630 and a second load roller 1632. The first load roller 1630 and the second load roller 1632 produce loads to flatten the panel of material 210 near or proximate the indentation roller 1620. The panel 210 is placed over a flat, stiff plate 510. The flat, stiff plate 510 includes a flat, stiff surface 511 which produces forces counteracting the forces produced by the load rollers 1630, 1632. The force produced by the load rollers 1630 and 1632 are depicted by arrows carrying the reference numerals 1650 and 1652. The counteracting forces produced by the stiff, flat plate 510 are shown by arrows carrying the reference numerals 1660 and 1662.

Figure 17:
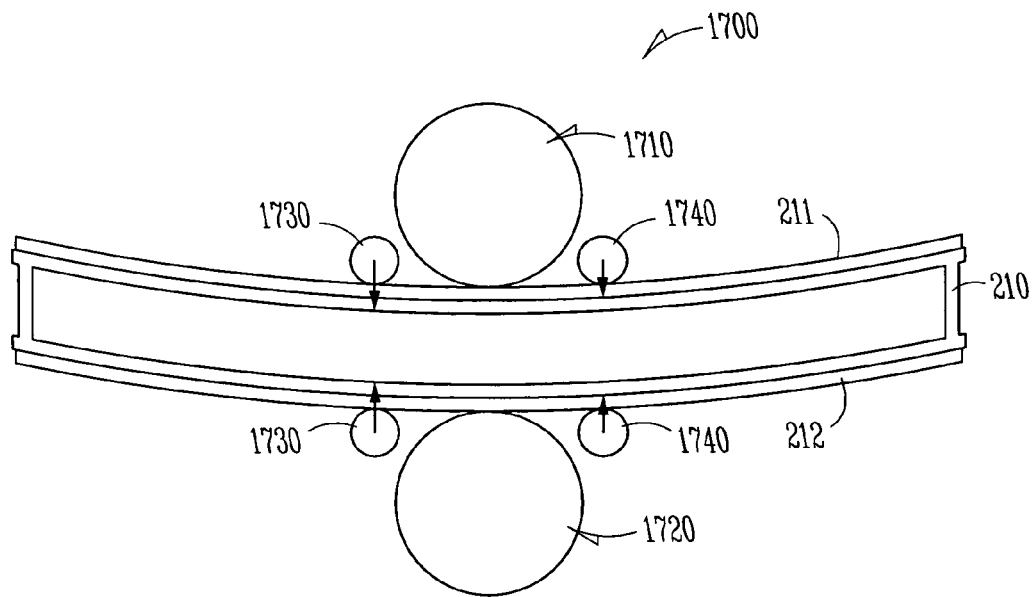
FIG. 17 is a side view of a grinder mechanism for removing at least a portion of the plated material from two major surfaces of the panel substantially simultaneously, according to an embodiment of this invention.

FIG. 17 is a side view of a grinder mechanism 1700 for removing at least a portion of the plated material from the first major surface 211 and from the second major surface 212 of the panel of material substantially simultaneously 210, according to an embodiment of this invention. The grinding mechanism 1700 includes a first grinding wheel 1710 and a second grinding wheel 1720. The first grinding wheel 1710 removes material from the top surface associated with the first major surface 211 and the second grinding wheel 1720 removes material associated with the second major surface 212 of the panel of material 210. The grinding wheels 1710 and 1720 work substantially simultaneously to remove material such as electrically conductive material that has been plated on the surfaces 211 and 212. The grinding mechanism 1700 also includes a first pair of opposed load rollers 1730 and a second pair of opposed load rollers 1740 which flatten the panel of material 210 near the first grinding wheel 1710 and the second grinding wheel 1720.

Figure 18:
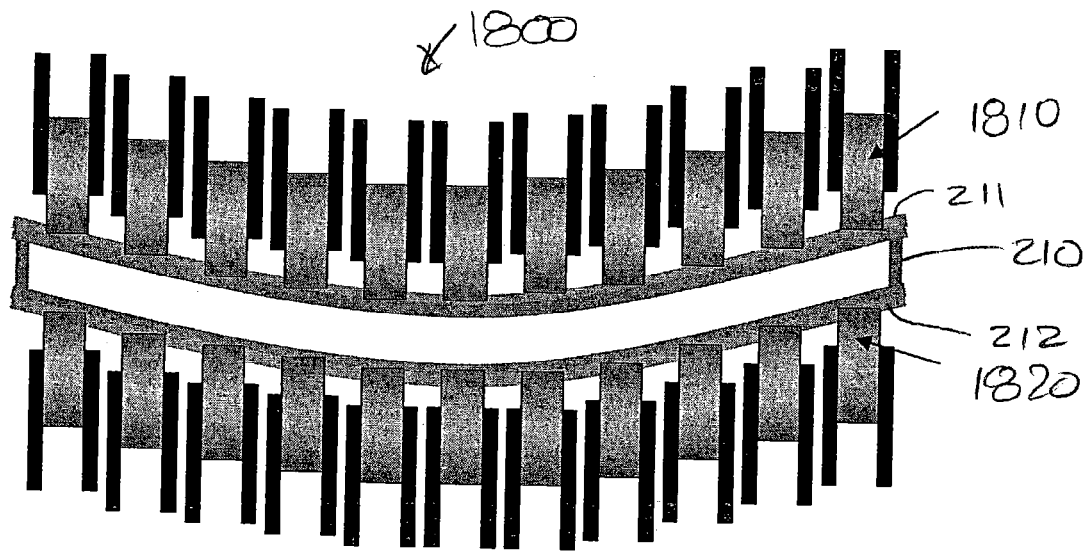
FIG. 18 is a side view of a grinder mechanism for removing at least a portion of the plated material from two major surfaces of the panel substantially simultaneously, according to an embodiment of this invention.

FIG. 18 is a side view of a grinder mechanism 1800 for removing at least a portion of the plated material from two major surfaces of the panel 210 substantially simultaneously, according to an embodiment of this invention. The grinding mechanism 1800 includes a first set of a plurality of grinders 1810 and a second set of a plurality of grinders 1820. The first set of the plurality of grinders 810 is used to remove material from the first major surface 211 of the panel of material 210. The second set of grinding devices 1820 removes material associated with the second major surface 212 of the panel of material 210.

Figure 19:
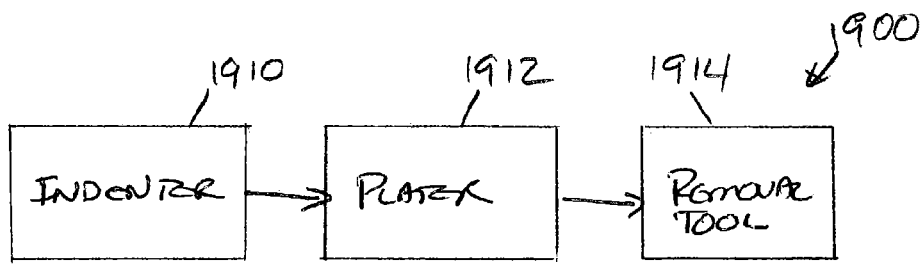
FIG. 19 is a schematic view of a system for forming printed circuit boards, according to an embodiment of this invention.

FIG. 19 is a schematic view of a system 1900 for forming printed circuit boards, according to an embodiment of this invention. The system includes an indenter 1910, a plater or depositor of conductive material 1912, and a removal tool 1914 for removing portions of conductive material from major surfaces of a substrate or panel of material 210 (shown in FIG. 2).

Now, with respect to FIG. 19 and FIGS. 2–18, a system for making a conductive circuit on a substantially non-conductive substrate includes an indenter 1910 that forms a plurality of indentations on a first major surface 211 of the substrate 210, a plater that plates conductive material 311, 312 on the major surface 211, 212 of the substrate 210 (shown in FIG. 2) and within the indentations formed in the major surface 211, 212 of the substrate 210, (shown in FIG. 2) and a removal tool or grinder 1914 that removes a portion of the conductive material plated on the major surface of the substrate to leave conductive material within the indentations in the major surface of the substrate. The conductive material 311, 312 (shown in FIG. 3) within at least some of the plurality of indentations is separated from the conductive material within some of the other indentations by non-insulative material. The grinder 1914 removes a portion of the conductive material 311, 312 (shown in FIG. 3) within the plurality of indentations. The grinder 1914 also removes a portion of the conductive material within the plurality of indentations to form a planar surface including non-conductive material and conductive material. The indenter 1910 includes a plate having a negative of the indentations in the substrate. In some embodiments, the indenter 1910 is a roller. The roller includes an interchangeable plate having a negative of the indentations in the substrate. The indentations include at least one channel, at least one pad, or at least one via. In some embodiments, the indenter 1910 includes a plurality of planar surfaces. The indenter 1910, in some embodiments, has multiple sides.

A system 1900 for making a conductive circuit on a substantially non-conductive substrate 1900 includes a first roller apparatus that forms a plurality of indentations on a first major surface of the substrate 221 (shown in FIG. 2), and a second roller apparatus that forms a plurality of indentations on a second major surface of the substrate 222 (shown in FIG. 2). The system for making a conductive circuit on a substantially non-conductive substrate further includes a plater 1912 that plates conductive material on the first major surface of the substrate 211 (shown in FIG. 2) and on the second major surface of the substrate 212 (shown in FIG. 2) and within the indentations formed in the first major surface of the substrate and in the second major surface of the substrate 210 (shown in FIG. 2), and a grinder apparatus 1914 that removes a portion of the conductive material plated on the first major surface of the substrate leaving conductive material within the indentations in the first major surface of the substrate, and removes a portion of the conductive material plated on the second major surface of the substrate leaving conductive material within the indentations in the second major surface of the substrate, wherein the conductive material within at least some of the plurality of indentations is separated from the conductive material within some of the other indentations by non-insulative material. In some embodiments, the grinder apparatus includes a plurality of grinders. In some embodiments of the invention, the first roller apparatus is comprised of a plurality of rollers.

Figure 20:
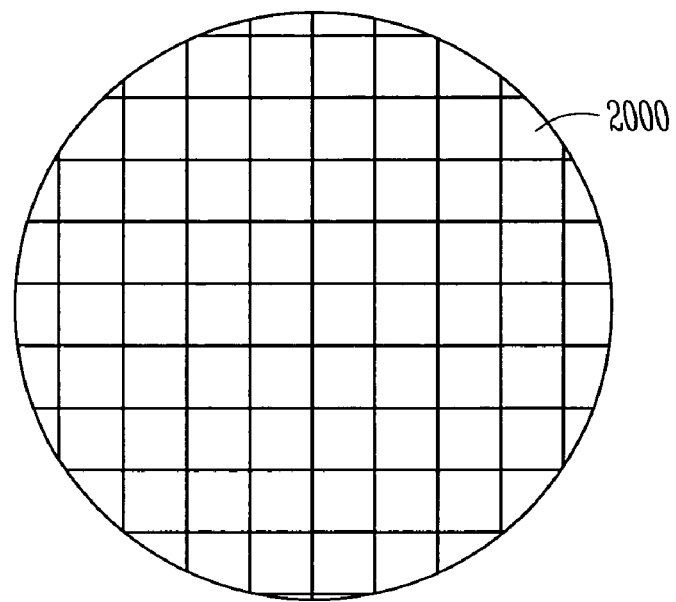
FIG. 20 is a top view of a wafer, according to an embodiment of this invention.
Figure 21:
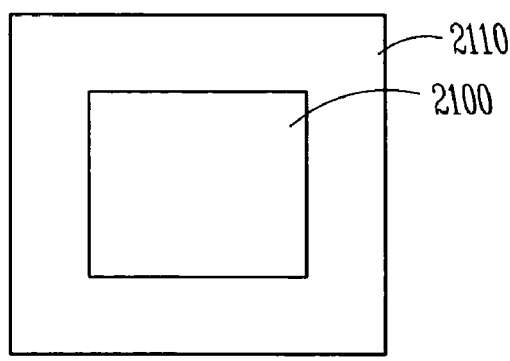
FIG. 21 is a top view of a die within a package, according to an embodiment of this invention.

Although the invention has been described above using a printed circuit card as an example of a substrate, it should be noted that the invention contemplates application to any type of substrate. A substrate includes a wafer and a die within a package. FIG. 20 is a top view of a wafer 2000, according to an embodiment of this invention. The wafer 2000 shown has markings thereon indicating the portions of the wafer that will be individual dies or chips. In reality, the markings on the surface of the wafer 2000 are not present. FIG. 21 is a top view of a die 2100 within a package 2110, according to an embodiment of this invention. The die 2100 is one type of substrate that this invention includes and the package 2110 is another type of substrate the invention includes.

The foregoing description of the specific embodiments reveals the general nature of the invention sufficiently so that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A system for making a conductive circuit on a substantially non-conductive substrate, the system comprising:
    an indenting roller having a pattern surface adapted to form a plurality of indentations on a major surface of the substrate, the indentations for receiving conductive material;
    a plater adapted to plate conductive material on the major surface of the substrate and within the indentations formed in the major surface of the substrate; and
    a grinder adapted to remove a portion of the conductive material plated on the major surface of the substrate to leave conductive material within the indentations in the major surface of the substrate.

2. The system according to claim 1 wherein the grinder is adapted to remove a portion of the conductive material between the plurality of indentations.

3. The system according to claim 1 wherein the grinder is adapted to remove a portion of the conductive material within the plurality of indentations.

4. The system according to claim 1 wherein the grinder is adapted to remove a portion of the conductive material within the plurality of indentations and the conductive material over the non-conductive material between the indentations to form a planar surface including non-conductive material and conductive material.

5. The system of claim 1 wherein the indenting roller is adapted to form indentations which form an opening in the substrate.

6. The system of claim 1 wherein the indenting roller is adapted to form indentations which form an opening passing through the substrate.

7. The system of claim 1 wherein the indenting roller is adapted to plastically deform the substrate.

8. The system of claim 1 wherein the substrate is formed of non-conductive plastic.

9. The system of claim 1 wherein in the indenting roller further comprises:
    a first roller apparatus adapted to form a plurality of indentations in the substrate; and
    a second roller apparatus adapted to form a plurality of indentations in the substrate.

10. The system of claim 1 wherein the conductive material within at least some of the plurality of indentations is separated from the conductive material within some of the other indentations by insulative material.

11. The system according to claim 10 wherein the grinder removes a portion of the conductive material within the plurality of indentations.

12. The system according to claim 10 wherein the grinder removes a portion of the conductive material within the plurality of indentations and the conductive material over the non-conductive material between the indentations to form a planar surface including non-conductive material and conductive material.

13. The system according to claim 10 wherein the indenting roller includes a plate having a negative of the indentations in the substrate.

14. The system of claim 10 wherein the indentations include at least one channel.

15. The system of claim 10 wherein the indentations include at least one pad.

16. The system of claim 10 wherein the indentations include at least one via.

17. The system of claim 10 further comprising another indenting roller having another pattern surface adapted to form a plurality of indentations on another major surface of the substrate.

18. The system of claim 10 wherein the grinder further comprises a plurality of grinding elements.

19. The system of claim 10 wherein the indenting roller further comprises a plurality of indenting devices.

20. The system of claim 10 wherein the indenting roller is adapted to form indentations which form an opening in the substrate.

21. The system of claim 10 wherein the indenting roller is adapted to form indentations which form an opening passing through the substrate.

22. The system of claim 10 wherein the indenting roller is adapted to plastically deform the substrate.

23. The system of claim 10 wherein the substrate is formed of non-conductive plastic.

24. The system of claim 10 further comprising a base, the base producing a force that counteracts the indenter.

25. The system of claim 10 further comprising:
a first load roller; and
a second load roller, wherein the first load roller and the second load roller are adapted to place a load on the major surface of the substrate and on another surface of the substrate.

26. The system according to claim 10 wherein the grinder removes a portion of the conductive material between the plurality of indentations.

27. The system of claim 1 wherein the indenting roller includes an interchangeable plate having a negative of the indentations in the substrate.

* * * * *